(12) United States Patent
Lai et al.

(10) Patent No.: US 8,570,673 B2
(45) Date of Patent: Oct. 29, 2013

(54) SPACER AND LENS MODULE

(75) Inventors: Chien-Nan Lai, New Taipei (TW); Hung-Lung Ho, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 153 days.

(21) Appl. No.: 13/340,601

(22) Filed: Dec. 29, 2011

(65) Prior Publication Data

US 2013/0050853 A1   Feb. 28, 2013

(30) Foreign Application Priority Data

Aug. 25, 2011   (TW) .............................. 100130509 A

(51) Int. Cl.
*G02B 7/02*   (2006.01)
(52) U.S. Cl.
USPC ........................................................ 359/819

(58) Field of Classification Search
USPC .................................................. 359/811–819
See application file for complete search history.

(56) References Cited

U.S. PATENT DOCUMENTS 7,196,857 B2 *   3/2007   Kazama ......................... 359/811

* cited by examiner

*Primary Examiner* — Tuyen Tra
(74) *Attorney, Agent, or Firm* — Altis & Wispro Law Group, Inc.

(57) ABSTRACT

A spacer includes an object-side surface, an image-side surface, and an outer sidewall. The image-side surface is opposite to the object-side surface. The outer sidewall defines a first cutout and a second cutout. The first cutout and the second cutout penetrate through the object-side surface and the image-side surface. Contours of the first cutout and the second cutout are different from each other.

14 Claims, 3 Drawing Sheets

SPACER AND LENS MODULE

BACKGROUND

1. Technical Field

The present disclosure relates to optical elements and, particularly, to a spacer and a lens module using the spacer.

2. Description of Related Art

In related art, a lens module includes a first lens, a second lens, and a spacer. The spacer is disposed between the first lens and the second lens and for blocking off-axis light rays to avoid aberrations. The spacer is typically annular and includes a cylindrical inner surface, and defines a chamfer facing an object-side end of the lens module to efficiently reflect off-axis light rays. The lens module is typically assembled manually. However, to reduce a total size of the lens module, the spacer is small, for example, an outer diameter of the spacer may be reduced to about 2 mm, and a width of the chamfer may be reduced to about 0.1 mm, such that it is difficult to indentify a proper orientation of the spacer such that chamfer faces the object-side end of the lens module by manual visual inspections.

Therefore, it is desirable to provide a spacer, which can overcome the limitations described.

DETAILED DESCRIPTION

Embodiments of the disclosure will now be described in detail, with reference to the accompanying drawings.

Figure 1:
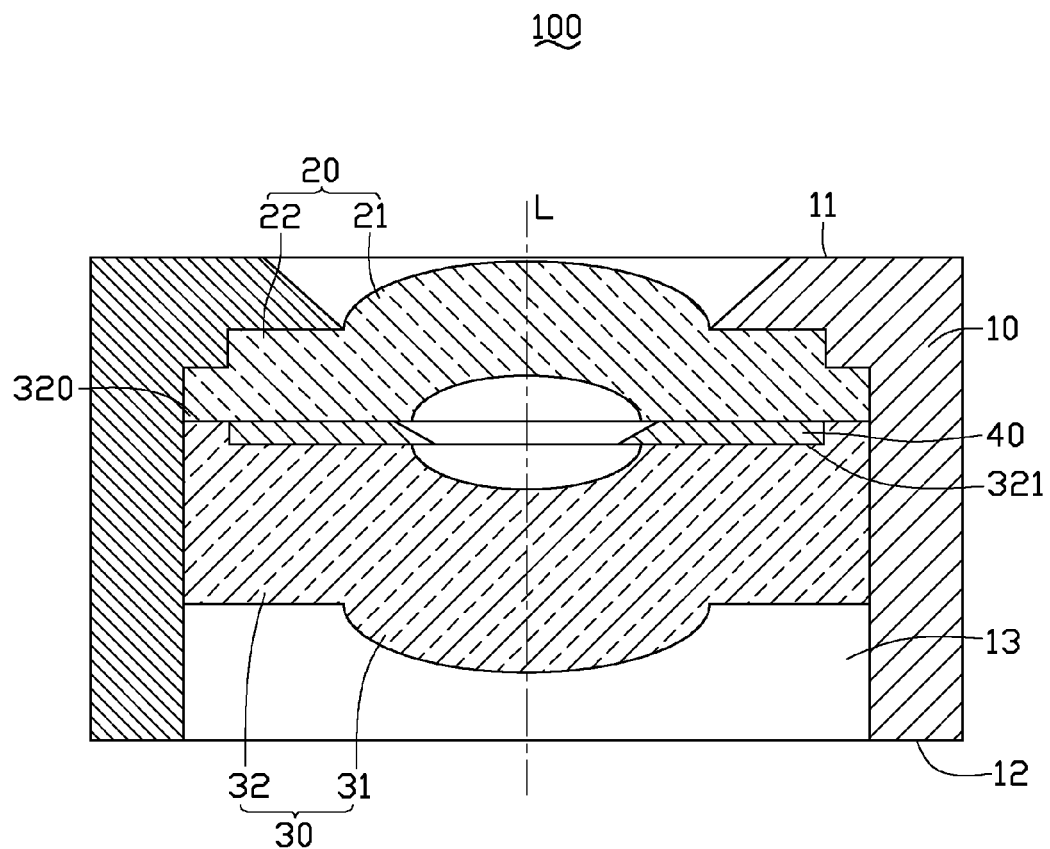
FIG. 1 is a cross-sectional schematic view of a lens module of an exemplary embodiment.

FIG. 1, is a lens module 100, according to an exemplary embodiment, including a lens barrel 10, a first lens 20, a second lens 30, and a spacer 40.

The lens barrel 10 is tubular, and includes an object-side end 11 and an image-side end 12 opposite to the object-side end 11. The lens barrel 10 defines a through hole 13 extending from the object-side end 11 to the image-side end 12. In this embodiment, the lens barrel 10 is made of light-shielding/opaque/black material(s).

The first lens 20 is received in the through hole 13, adjacent to the object-side end 11. The first lens 20 includes a first optical portion 21 and a first non-optical portion 22 surrounding the first optical portion 21.

The second lens 30 is received in the through hole 13, adjacent to the image-side end 12 in relative to the first lens 20. The second lens 30 includes a second optical portion 31 and a second non-optical portion 32 surrounding the second optical portion 31. In this embodiment, the second non-optical portion 32 defines a receiving recess 321 on an object-side surface 320 of the second lens 30.

In this embodiment, the first lens 20 and the second lens 30 are made of glass or plastic, and may be spherical or aspheric lenses. The first optical portion 21 and the second optical portion 31 are for forming images. It is desirable that all light rays entering into the lens barrel 10 are collected to pass through the first optical portion 21 and the second optical portion 31. The first non-optical portion 22 and the second non-optical portion 32 are incidental and it is desired that no or as few as possible, light rays pass therethrough. In other configurations of the lens module 100, other lenses can be included and arranged at appropriate positions at the two sides of the first lens 10 and the second lens 20.

Figure 2:
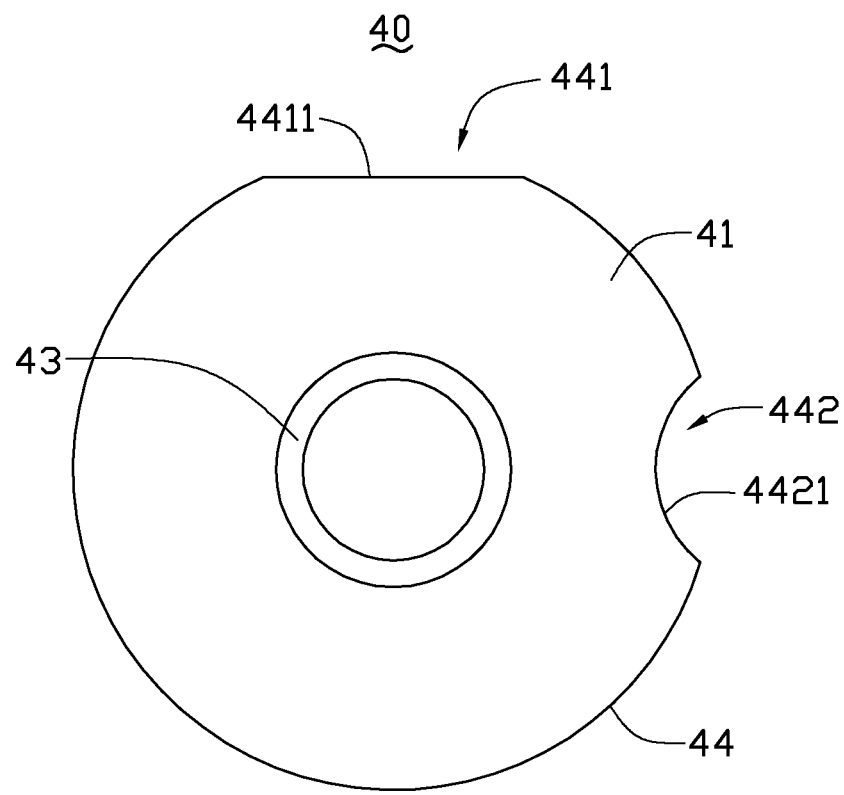
FIG. 2 is a front view of a spacer of the lens module of FIG. 1.
Figure 3:
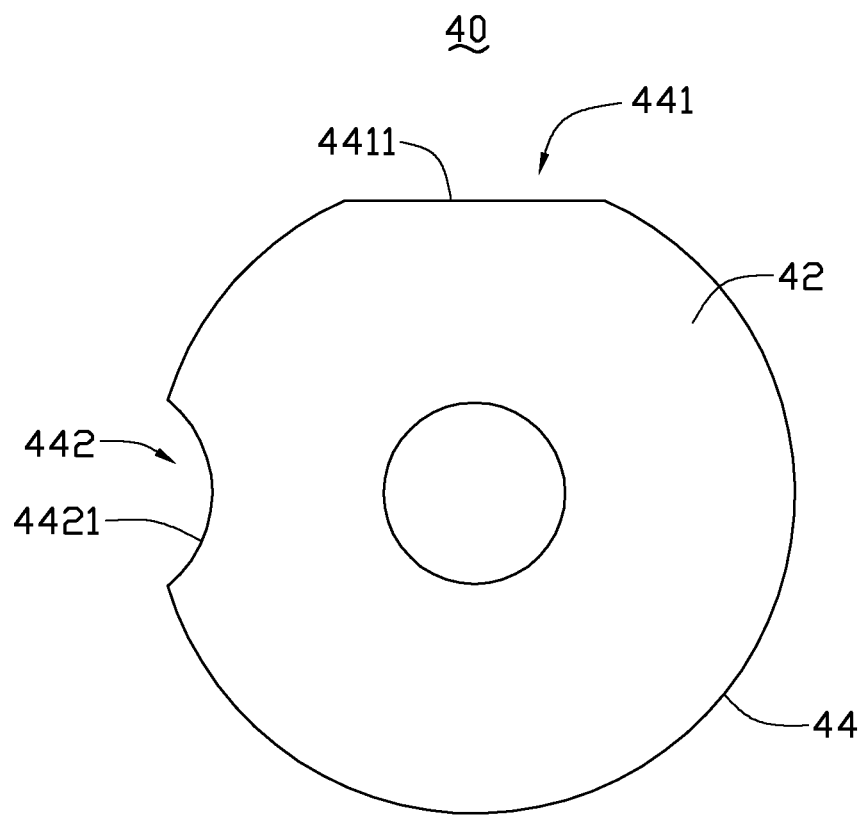
FIG. 3 is a rear view of the spacer of the lens module of FIG. 1.

FIGS. 2-3, show the spacer 40 is an annular plate and made of light-shielding/opaque/dark material(s). The spacer 40 is received in the receiving recess 321, and is positioned between the first lens 20 and the second lens 30. The spacer 40 has a cross-section perpendicular to an optical axis L of the lens module 100 greater than that of the first and second optical portions 21, 31. The spacer 40 includes an object-side surface 41, an image-side surface 42, an cylindrical inner sidewall 43, and a cylindrical outer sidewall 44. The object-side surface 41 faces the object-side end 11 of the lens module 10, and the image-side surface 42 faces the image-side end 12. The outer sidewall 44 is a cylindrical surface rotationally symmetrical about the optical axis L of the lens module 100.

The inner sidewall 43 is inclined in relative to the optical axis L of the lens module 100 and faces the object-side end 11. An included angle is formed between the inner sidewall 43 and the optical axis L of the lens module 100. The included angle is open toward the object-side end 11, and is larger than about 30 degrees but less than about 60 degrees. The spacer 40 is sandwiched between the first non-optical portion 22 and the second non-optical portion 32.

The spacer 40 defines a first cutout 441 and a second cutout 442 on the outer sidewall 44. Contours of the first cutout 441 and the second cutout 442 have different shapes, and are located at two different diameters of the spacer 40. The first cutout 441 and the second cutout 442 respectively penetrate through the object-side surface 41 and the image-side surface 42. A first projection of the spacer 40 projected in a direction from the object-side surface 41 to the image-side surface 42 is different from a second projection of the spacer 40 projected in another direction from the image-side surface 42 to the object-side surface 41. In this embodiment, the contours of the first cutout 441 and the second cutout 442 can be distinctly distinguished by visual inspection.

The first cutout 441 includes a first lower surface 4411 connected to the outer sidewall 44, and the first lower surface 4411 is flat. The second cutout 442 includes a second lower surface 4421 connected to the outer sidewall 44, and the second lower surface 4421 is concave. The second cutout 442 is positioned at a clockwise direction of the first cutout 441 when looking at the object-side surface 41. The second cutout 442 is positioned at a counterclockwise direction of the first cutout 441 when looking at the image-side surface 42.

In this embodiment, a first vertical line from a center point of the first lower surface 4411 of the first cutout 441 to the optical axis L is perpendicular to a second vertical line from a center point of the second lower surface 4421 of the second cutout 442 to the optical axis L.

During assembling, the first lens 20 is first assembled into the lens barrel 10 by a special jig, an object-side surface of the first lens 20 is adjacent to the object-side end 11 of the lens module 10. The spacer 40 is picked by tweezers, the operators observe the spacer 40 from the object-side surface 41 to the image-side surface 42 or from the image-side surface 42 to the object-side surface 41. When the second cutout 442 is positioned at right of the first cutout 441, that means this surface facing the operators is the object-side surface 41. When the second cutout 442 is positioned at left of the first cutout 441, that means this surface facing the operator is the image-side surface 42. The spacer 40 is positioned in the receiving recess 321 by the image-side surface 42 facing the second lens 30. The spacer 40 and the second lens 30 are received in the through hole 13, and the object-side surface 41 faces the first lens 20.

In this embodiment, in order to improve convenience of observing the spacer 40. The operators can rotate the spacer 40 as the first cutout 441 is located at twelve o'clock. Therefore, the second cutout 442 can be directly observed to the right or left of the first cutout 441.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A spacer, comprising:
   an object-side surface;
   an image-side surface opposite to the object-side surface; and
   an outer sidewall defining a first cutout and a second cutout; the first cutout and the second cutout penetrating through the object-side surface and the image-side surface; contours of the first cutout and the second cutout being different from each other;
   wherein a first projection of the spacer projected in a direction from the object-side surface to the image-side surface is different from a second projection of the spacer projected in another direction from the image-side surface to the object-side surface.

2. The spacer of claim 1, wherein the first cutout comprises a first lower surface connecting the outer sidewall, and the first lower surface is flat; the second cutout comprises a second lower surface connecting the outer sidewall, and the second lower surface is concave.

3. The spacer of claim 2, wherein the second cutout is positioned at a clockwise direction of the first cutout when looking at the object-side surface; the second cutout is positioned at a counterclockwise direction of the first cutout when looking at the image-side surface.

4. The spacer of claim 2, wherein a first vertical line from a center point of the first lower surface to an optical axis of the spacer is substantially perpendicular to a second vertical line from a center point of the second lower surface to the optical axis.

5. The spacer of claim 1, wherein the first cutout and the second cutout are located at two different diameters of the spacer.

6. The spacer of claim 1, comprising an inner sidewall, wherein the inner sidewall is inclined in relative to the optical axis.

7. The spacer of claim 1, wherein the outer sidewall is a cylindrical surface symmetrical about the optical axis of the spacer.

8. A lens module, comprising:
   a lens barrel comprising an object-side end and an image-side end opposite to the object-side end;
   a first lens received in the lens barrel, and adjacent to the object-side end;
   a second lens received in the lens barrel, and adjacent to the image-side end in relative to the first lens; and
   a spacer positioned between the first lens and the second lens, the spacer comprising:
      an object-side surface;
      an image-side surface opposite to the object-side surface; and
      an outer sidewall defining a first cutout and a second cutout; the first cutout and the second cutout penetrating through the object-side surface and the image-side surface; contours of the first cutout and the second cutout being different from each other;
      wherein a first projection of the spacer projected in a direction from the object-side surface to the image-side surface is different from a second projection of the spacer projected in another direction from the image-side surface to the object-side surface.

9. The lens module of claim 8, wherein the first cutout comprises a first lower surface connecting the outer sidewall, and the first lower surface is flat; the second cutout comprises a second lower surface connecting the outer sidewall, and the second lower surface is concave.

10. The lens module of claim 9, wherein the second cutout is positioned at a clockwise direction of the first cutout when looking at the object-side surface; the second cutout is positioned at a counterclockwise direction of the first cutout when looking at the image-side surface.

11. The lens module of claim 9, wherein a first vertical line from a center point of the first lower surface to an optical axis of the spacer is substantially perpendicular to a second vertical line from a center point of the second lower surface to the optical axis.

12. The lens module of claim 8, wherein the first cutout and the second cutout are located at two different diameters of the spacer.

13. The lens module of claim 8, comprising an inner sidewall, wherein the inner sidewall is inclined in relative to the optical axis.

14. The lens module of claim 8, wherein the outer sidewall is a cylindrical surface symmetrical about the optical axis of the spacer.

* * * * *